(12) United States Patent
Lin et al.

(10) Patent No.: US 11,610,638 B2
(45) Date of Patent: Mar. 21, 2023

(54) SAMPLE HOLDING CIRCUIT OF REDUCED COMPLEXITY AND ELECTRONIC DEVICE USING THE SAME

(71) Applicant: JADARD TECHNOLOGY INC., Shenzhen (CN)

(72) Inventors: Feng-Wei Lin, Tainan (TW); Yu-Chieh Hsu, Tainan (TW); Hong-Yun Wei, Shenzhen (CN)

(73) Assignee: JADARD TECHNOLOGY INC., Shenzhen (CN)

( * ) Notice: Subject to any disclaimer, the term of this patent is extended or adjusted under 35 U.S.C. 154(b) by 0 days.

(21) Appl. No.: 17/392,553

(22) Filed: Aug. 3, 2021

(65) Prior Publication Data
US 2022/0406391 A1    Dec. 22, 2022

(30) Foreign Application Priority Data

Jun. 18, 2021   (CN) .......................... 202110678394.6

(51) Int. Cl.
*G11C 27/02* (2006.01)
*H03M 1/12* (2006.01)

(52) U.S. Cl.
CPC ........... *G11C 27/02* (2013.01); *H03M 1/1245* (2013.01)

(58) Field of Classification Search
CPC .. H03M 1/1245; H03M 1/125; H03M 1/1255; H03M 1/1265; H03M 1/1285; G11C 27/02; G11C 27/024; G11C 27/026; G11C 27/028
See application file for complete search history.

(56) References Cited

U.S. PATENT DOCUMENTS

| | | | |
|---|---|---|---|
| 2008/0001799 A1* | 1/2008 | Nam | ........................ H03M 1/50 341/122 |
| 2013/0285705 A1* | 10/2013 | Kabir | ................... G11C 27/024 327/94 |
| 2021/0143835 A1 | 5/2021 | Gonzalez et al. | |

FOREIGN PATENT DOCUMENTS

| | | |
|---|---|---|
| CN | 107147394 A | 9/2017 |
| CN | 109412595 A | 3/2019 |
| CN | 110336565 A | 10/2019 |

* cited by examiner

*Primary Examiner* — Long Nguyen
(74) *Attorney, Agent, or Firm* — ScienBiziP, P.C.

(57) ABSTRACT

A sample holding circuit includes a signal input terminal, a first sampling unit, a second sampling unit, and a holding unit. The signal input terminal receives a first reference voltage or a second reference voltage, the first sampling unit samples the first reference voltage when a first clock signal is triggered to obtain a first sampling voltage, the second sampling unit samples the second reference voltage when a second clock signal is triggered to obtain a second sampling voltage. The holding unit receives the first sampling voltage and the second sampling voltage when a third clock signal is triggered. The sample holding circuit effectively simplifies circuit structure and reduces the use of amplifiers, also improving the signal to noise ratio.

16 Claims, 6 Drawing Sheets

SAMPLE HOLDING CIRCUIT OF REDUCED COMPLEXITY AND ELECTRONIC DEVICE USING THE SAME

FIELD

The subject matter herein generally relates to data processing and electronic device.

BACKGROUND

When performing digital conversion to an analog signal, a certain conversion time is required. During this time, the analog signal must remain basically unchanged, so as to ensure the conversion accuracy. The sample holding circuit is the circuit that realizes this function. However, the circuit structure of existing sample holding circuit is complicated, occupies a large area on the circuit board, and has a low signal-to-noise ratio.

Therefore, there is a room for improvement.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Figure 1:
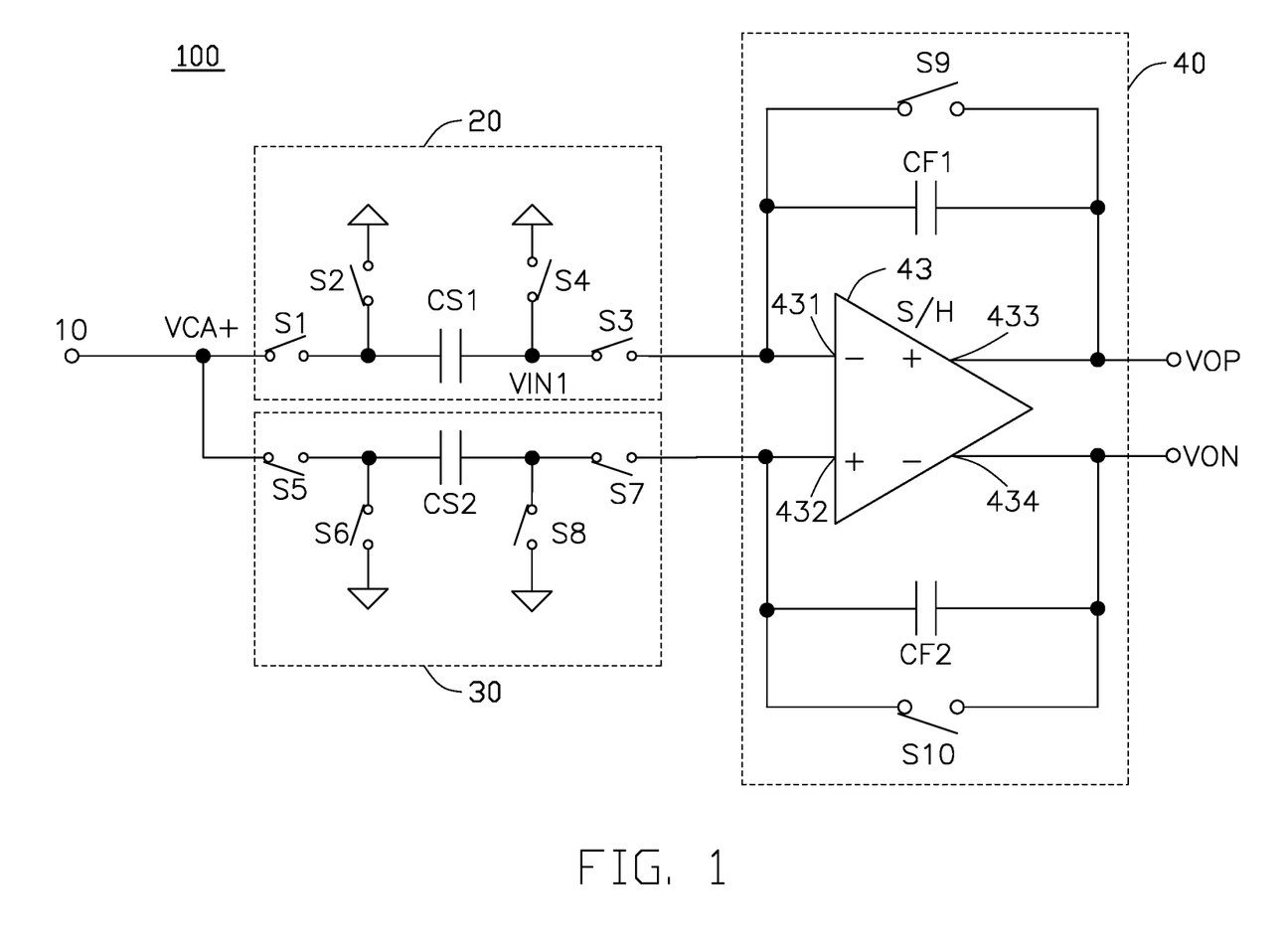
FIG. 1 is schematic diagram of an embodiment of a sample holding circuit according to the present disclosure.

FIG. 1 shows a schematic diagram of one embodiment of a sample holding circuit 100 of the present disclosure.

The sample holding circuit 100 collects an electrical signal at a certain moment, and outputs another electrical signal that maintains the same value as the electrical signal.

The sample holding circuit 100 includes a signal input terminal 10, a first sampling unit, a second sampling unit 30, and a holding unit 40.

Figure 2:
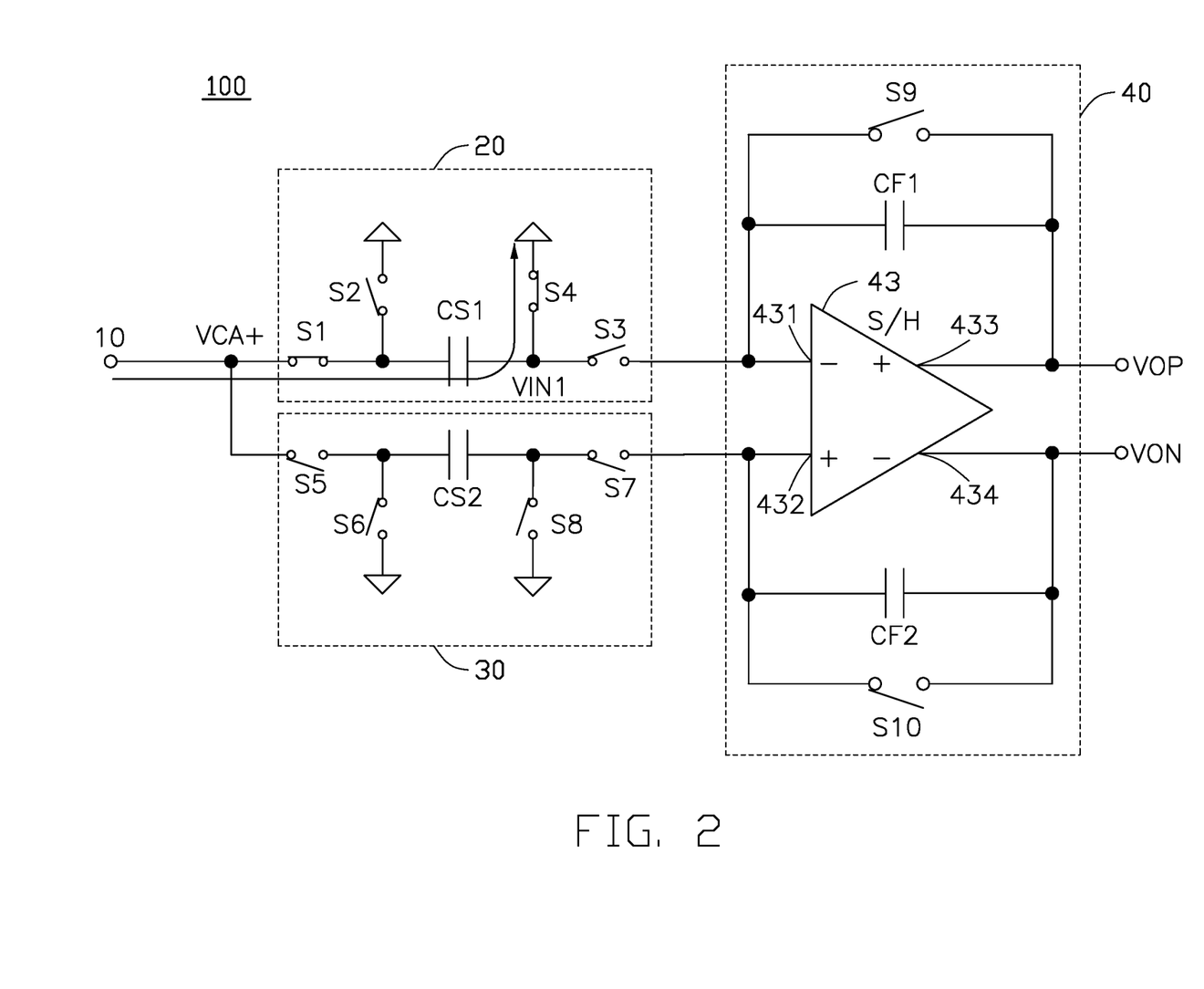
FIG. 2 is a schematic diagram of an embodiment of the sample holding circuit of FIG. 1 when a first clock signal is triggered.
Figure 3:
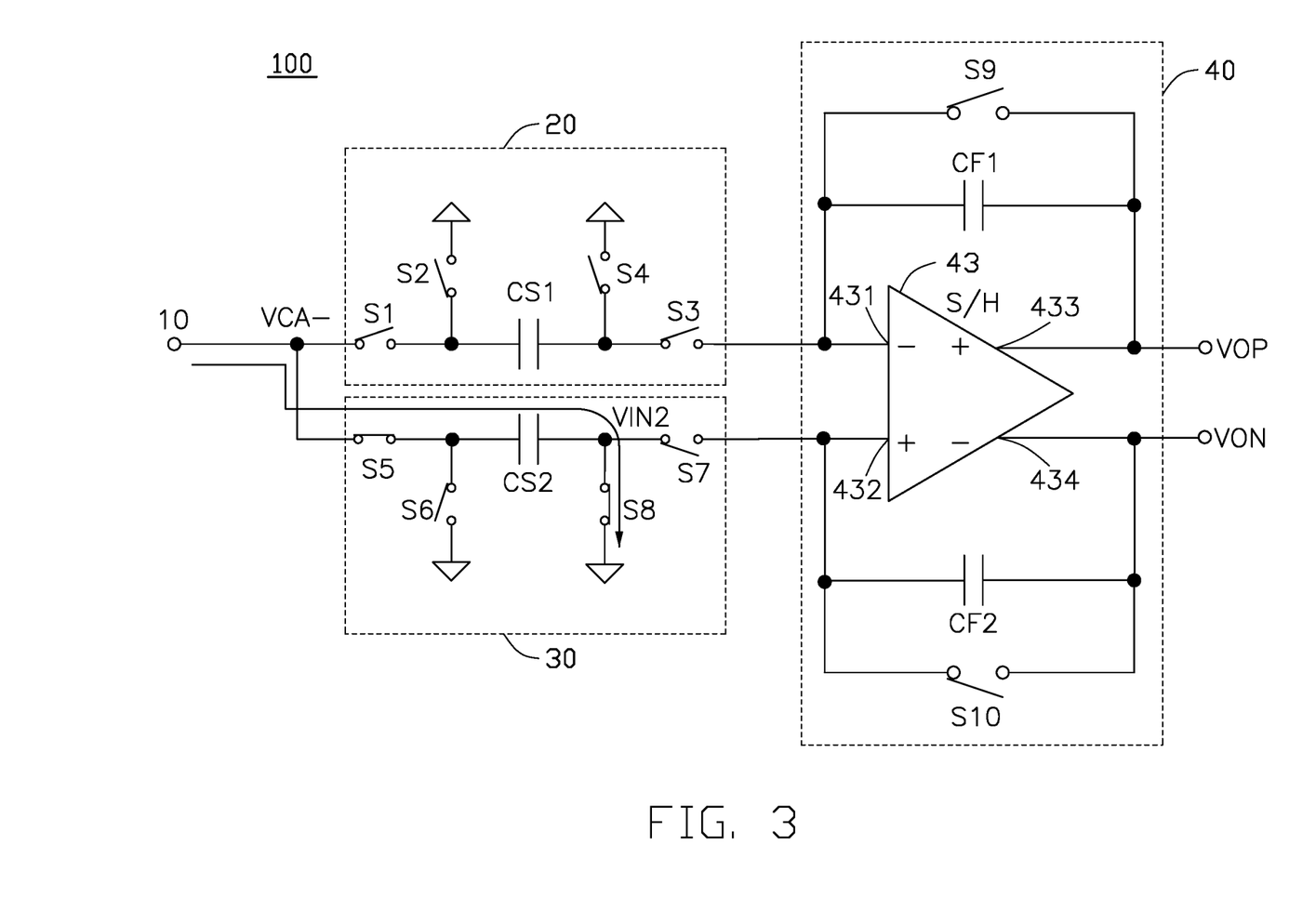
FIG. 3 is a schematic diagram of an embodiment of the sample holding circuit of FIG. 1 when a second clock signal is triggered.

The signal input terminal 10 is used to receive a first reference voltage VCA+ (shown in FIG. 2) or a second reference voltage VCA− (shown in FIG. 3). The voltage values of the first reference voltage VCA+ and the second reference voltage VCA− are equal, and the polarities are opposite.

The first sampling unit 20 is electrically connected to the signal input terminal 10 for sampling the first reference voltage VCA+ when the first clock signal is triggered, to obtain a first sampling voltage VIN1. In the embodiment, the first sampling unit 20 includes a first switch S1, a second switch S2, a first sampling capacitor CS1, a third switch S3, and a fourth switch S4.

A first terminal of the first switch S1 is electrically connected to the signal input terminal 10, and a second terminal of the first switch S1 is electrically connected to a first terminal of the first sampling capacitor CS1, a second terminal of the first sampling capacitor CS1 is electrically connected to a first terminal of the third switch S3, and a second terminal of the third switch S3 is electrically connected to the holding unit 40.

A first terminal of the second switch S2 is grounded, and a second terminal of the second switch S2 is electrically connected between the first switch S1 and the first sampling capacitor CS1. The first terminal of the fourth switch S4 is grounded, and the second terminal of the fourth switch S4 is electrically connected between the first sampling capacitor CS1 and the third switch S3.

As shown in FIG. 2, when the signal input terminal 10 receives the first reference voltage VCA+ and the first clock signal is triggered, the first clock signal turns on the first switch S1 and the fourth switch S4, and turns off other switches (such as the second switch S2, the third switch S3, and fifth to eighth switches S5-S8 as hereinafter explained). The signal input terminal 10 receives the first reference voltage VCA+ to charge the first sampling capacitor CS1, thereby outputting the first sampling voltage VIN1 through the first sampling capacitor CS1, so as to complete the sampling of the first reference voltage VCA+. It can be understood that the voltage values of the first sampling voltage VIN1 and the first reference voltage VCA+ are the same, and the polarities are the same.

It can be understood that while sampling the first reference voltage VCA+, noise VN1 is also sampled.

The second sampling unit 30 is electrically connected to the signal input terminal 10 for receiving the second reference voltage VCA−, to obtain the second sampling voltage VIN2.

In the embodiment, the second sampling unit 30 includes a fifth switch S5, a sixth switch S6, a second sampling capacitor CS2, a seventh switch S7, and an eighth switch S8.

A first terminal of the fifth switch S5 is electrically connected to the signal input terminal 10, and a second terminal of the fifth switch S5 is electrically connected to a first terminal of the second sampling capacitor CS2, a second terminal is electrically connected to a first terminal of the seventh switch S7, and a second terminal of the seventh switch S7 is electrically connected to the holding unit 40. A first terminal of the sixth switch S6 is grounded, and the second terminal of the sixth switch S6 is electrically connected between the fifth switch S5 and the second sampling capacitor CS2. A first terminal of the eighth switch S8 is grounded, and a second terminal of the eighth switch S8 is electrically connected between the second sampling capacitor CS2 and the eighth switch S8.

As shown in FIG. 3, when the signal input terminal 10 receives the second reference voltage VCA− and the second clock signal is triggered, the second clock signal turns on the fifth switch S5 and the eighth switch S8, and turns off other switches (such as the first to fourth switches S1-S4, the sixth switch S6, and the seventh switch S7). The signal input terminal 10 receives the second reference voltage VCA− to charge the second sampling capacitor CS2, thereby outputting the second sampling voltage VIN2 through the second sampling capacitor CS2, so as to complete the sampling of the second reference voltage VCA−. It can be understood that the voltage values of the second sampling voltage VIN2 and the first reference voltage VCA+ are the same, and the polarities are the same.

It can be understood that while sampling the second reference voltage VCA−, noise VN2 is also sampled.

It can be understood that the value of the noise VN2 is equal to the value of the noise VN1, and the noise VN1 and the noise VN2 include flicker noise and white noise.

It can be understood that, the capacitance values of the second sampling capacitor CS2 and the first sampling capacitor CS1 are equal. Therefore, the voltage values of the second sampling voltage VIN2 and the first sampling voltage VIN1 are equal, and the polarities are opposite.

The holding unit 40 is electrically connected to the first sampling unit 20 and the second sampling unit 30 for receiving the first sampling voltage VIN1 and the second sampling voltage VIN2 when the third clock signal is triggered, to output a first voltage VOP and a second voltage VON.

In the embodiment, the holding unit 40 includes a first holding capacitor CF1, a second holding capacitor CF2, and a first amplifier 43.

In the embodiment, the capacitance value of the first holding capacitor CF1 is equal to the capacitance value of the second holding capacitor CF2.

The first amplifier 43 includes a first input terminal 431, a second input terminal 432, a first output terminal 433, and a second output terminal 434.

It can be understood that the first input terminal 431 is a negative input terminal, and the second input terminal 432 is a positive input terminal. The first output terminal 433 is a forward output terminal, and the second output terminal 434 is a reverse output terminal.

The first input terminal 431 is electrically connected to the second terminal of the third switch S3, the second input terminal 432 is electrically connected to the second terminal of the seventh switch S7, and both terminals of the first holding capacitor CF1 are electrically connected to the first input terminal 431 and the first output terminal 433. Both terminals of the second holding capacitor CF2 are electrically connected to the second input terminal 432 and the second output terminal 434.

Figure 4:
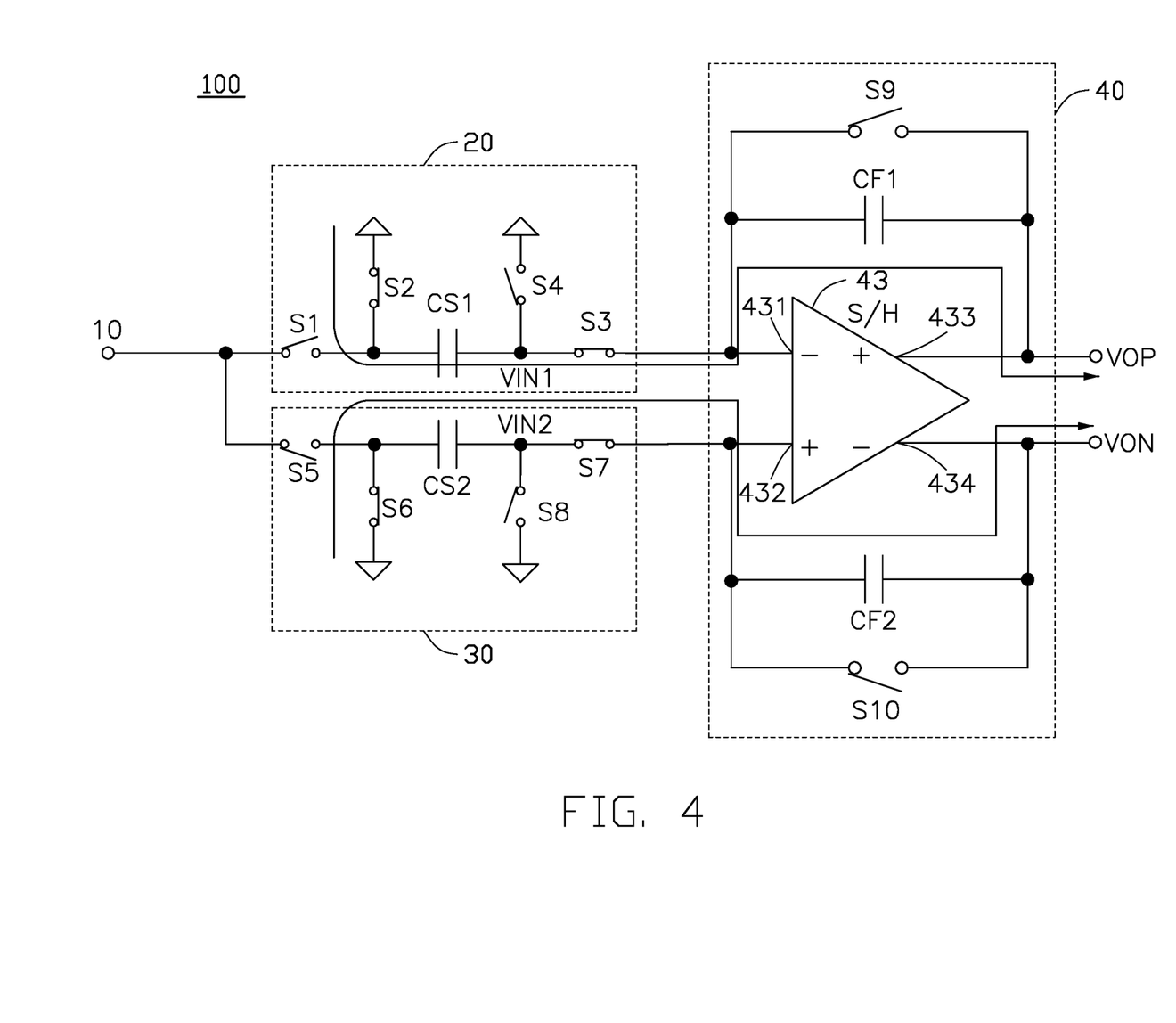
FIG. 4 is a schematic diagram of an embodiment of the sample holding circuit of FIG. 1 when a third clock signal is triggered.

As shown in FIG. 4, when the third clock signal is triggered, the third clock signal is used to turn on the second switch S2, the third switch S3, the sixth switch S6, and the seventh switch S7, and turns off other switches (such as the first switch S1, the fourth switch S4, the fifth switch S5, and the eighth switch S8). Therefore, the first input terminal 431 receives the first sampling voltage VIN1, the second input terminal 432 receives the second sampling voltage VIN2, the first output terminal 433 outputs the first voltage VOP, and the second output terminal 434 outputs the second voltage VON.

It can be understood that the first voltage VOP and the second voltage VON can be obtained according to the virtual short principle of the differential amplifier and formulas (1) and (2).

$$VOP=(CS1/CF1)\times(VIN1+VN1) \quad \text{(formula 1)}$$

$$VON=(CS2/CF2)\times(VIN2+VN2) \quad \text{(formula 2)}$$

In the embodiment, since the capacitance values of the first sampling capacitor CS1 and the second sampling capacitor CS2 are equal, the capacitance values of the first holding capacitor CF1 and the second holding capacitor CF2 are equal, and the voltage values of the first sampling voltage VIN1 and the second sampling voltage VIN2 are equal, and the polarities are opposite. The voltage values of the noise VN1 and the noise VN2 are equal, with same polarities. When the capacitance values of the first sampling capacitor CS1 and the first holding capacitor CF1 are equal, in the case of ignoring noise VN1 and noise VN2, the values of the first voltage VOP and the second voltage VON outputted by the holding unit 40 are the same as the values of the first reference voltage VCA+ and the second reference voltage VCA−, the holding unit 40 can output the same voltage value as the value at the sampling time.

It can be understood that the second voltage VON can be obtained by formula (3).

$$VON=(CS1/CF1)\times(-VIN1+VN1) \quad \text{(formula 3)}$$

When formula (3) is combined with formula (1), the difference of VOP−VON (the differential signal VDF, not shown in the figures) can be obtained, according to this formula (4).

$$VOP-VON=2(CS1/CF1)\times VIN1 \quad \text{(formula 4)}$$

It can be seen from formula (4) that the differential signal VDF has a proportional relationship with the first sampling voltage VIN1 and with the second sampling voltage VIN2, and the differential signal VDF has a proportional relationship with the first reference voltage VCA+ and the second reference voltage VCA−.

In the process of obtaining the differential signal, the noise VN1 and the noise VN2 cancel each other out, effectively reducing noise interference in the sampling process.

It can be understood that the first clock signal, the second clock signal, and the third clock signal are cyclically triggered in sequence, or the sequence may be the second clock signal, the first clock signal, and the third clock signal, cyclically triggered.

The holding unit 40 also includes a first reset switch S9 and a second reset switch S10 for respectively controlling the discharge of the first holding capacitor CF1 and the second holding capacitor CF2.

A first terminal of the first reset switch S9 is electrically connected between the first input terminal 431 and the first holding capacitor CF1, and a second terminal of the first reset switch S9 is electrically connected between the first output terminal 433 and the first holding capacitor CF1, the first reset switch S9 is connected in parallel with the first holding capacitor CF1. A first terminal of the second reset switch S10 is electrically connected between the second input terminal 432 and the second holding capacitor CF2, and a second terminal of the second reset switch S10 is electrically connected between the second output terminal 434 and the second holding capacitor CF2, the second reset switch S10 is connected in parallel with the second holding capacitor CF2.

It can be understood that when resampling is required, the first reset switch S9 and the second reset switch S10 can be respectively closed, thereby discharging the first holding capacitor CF1 and the second holding capacitor CF2, thereby resetting the sample holding circuit 100 to perform sampling again.

Figure 5:
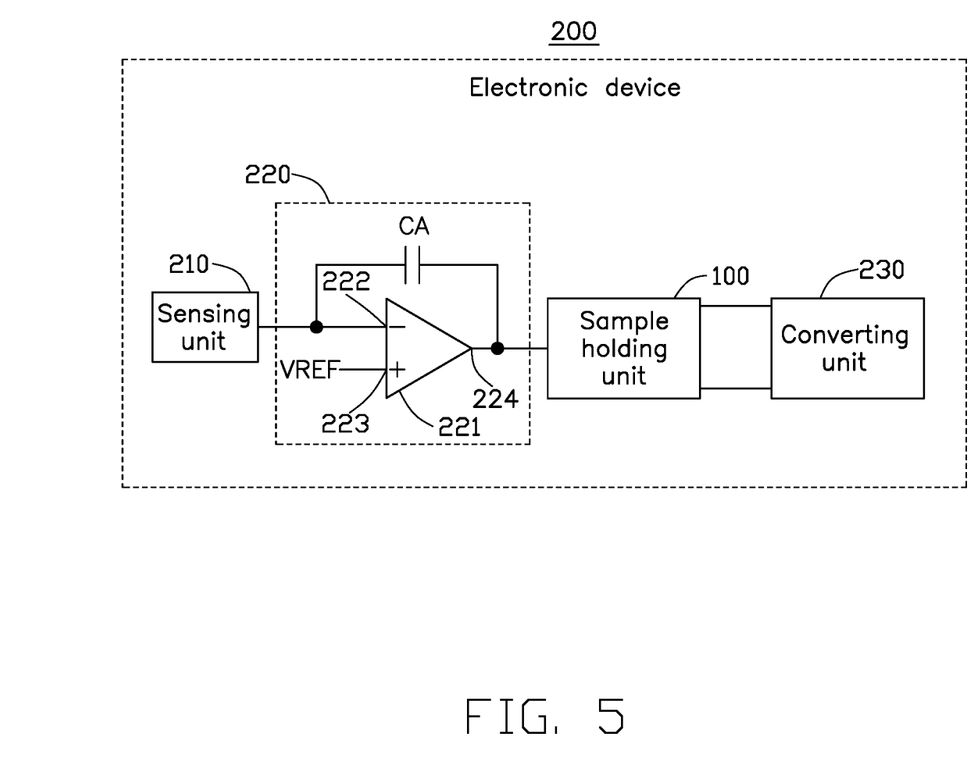
FIG. 5 is a schematic diagram of an embodiment of the sample holding circuit of FIG. 1 connected to other units.

Referring to FIG. 5, the sample holding circuit 100 can be disposed in an electronic device 200. The electronic device 200 may be a smart terminal or a camera having a sensing unit 210. For example, in the embodiment of the present disclosure, the electronic device 200 may further include a sensing unit 210, an amplifying unit 220, and a converting unit 230.

The sensing unit 210, the amplifying unit 220, the sample holding circuit 100, and the converting unit 230 are electrically connected in sequence. The output terminal of the amplifying unit 220 may constitute the signal input terminal 10 of the sample holding circuit 100, and the sample holding circuit 100 outputs the first voltage VOP and the second voltage VON to the converting unit 230.

The sensing unit 210 converts environmental signal into a charge signal, and outputs the charge signal to the amplifying unit 220. The amplifying unit 220 converts the charge signal output by the sensing unit 210 into a voltage signal, and amplifies the voltage signal, the amplified voltage signal then being output to the sample holding circuit 100, for providing a first reference voltage VCA+ or second reference voltage VCA−.

In one embodiment, the amplifying unit 220 includes a second amplifier 221 and a feedback capacitor CA. The second amplifier 221 includes a third input terminal 222, a fourth input terminal 223, and a third output terminal 224. The third input terminal 222 is the reverse input terminal of the second amplifier 221, and the fourth input terminal 223 is the forward input terminal of the second amplifier 221. The third input terminal 222 is electrically connected to the sensing unit 210. One terminal of the feedback capacitor CA is electrically connected between the third input terminal 222 and the sensing unit 210, and another terminal is electrically connected to the third output terminal 224. The third output terminal 224 is electrically connected to the sample holding circuit 100. The fourth input terminal 223 is electrically connected to the reference voltage VREF. The reference voltage VREF is a square wave pulse voltage, and can output a high level (such as a peak voltage) to the fourth input terminal 223, or output a low level (such as a zero level voltage) to the fourth input terminal 223.

When the third input terminal 222 receives the high level, the third output terminal 224 outputs the first reference voltage VCA+ to the sample holding circuit 100. When the third input terminal 222 receives the low level, the third output terminal 224 outputs the second reference voltage VCA− to the sample holding circuit 100.

The sample holding circuit 100 can sample the first reference voltage signal VCA+ or the second reference voltage signal VCA− output by the amplifying unit 220 at different moments. The sample holding circuit 100 is also electrically connected to the converting unit 230, to output the outputted first voltage VOP and the second voltage VON to the converting unit 230. The converting unit 230 may perform differential processing on the first voltage VOP and the second voltage VON to obtain the differential signal VDF, and then the differential signal is converted to obtain a digital signal, which is output to the corresponding control unit (not shown) to control the corresponding electronic components to perform an operation.

Figure 6:
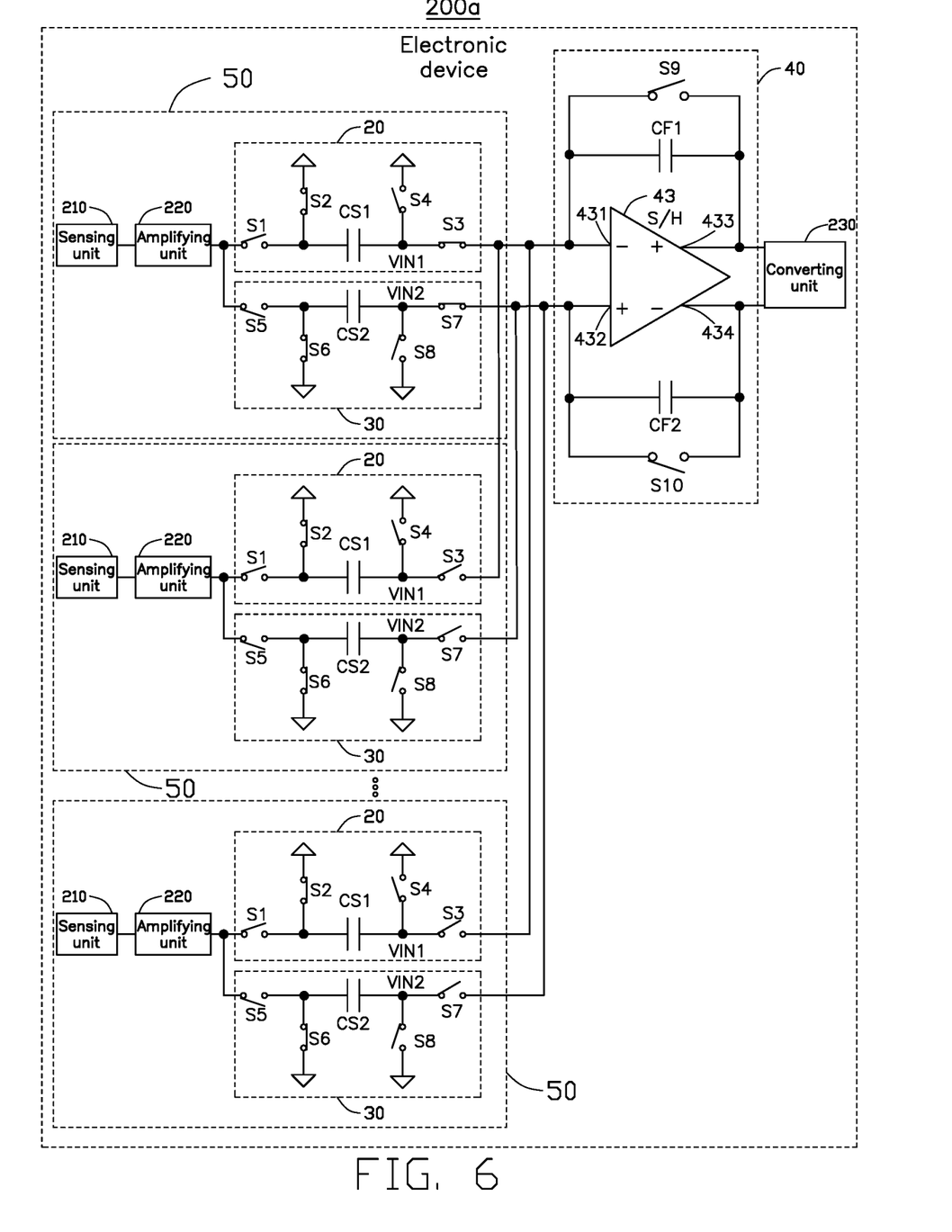
FIG. 6 is a schematic diagram of another embodiment of the sample holding circuit of FIG. 1 connected to other units.

Referring to FIG. 6, in other embodiments, the electronic device 200a may also include the converting unit 230, the holding unit 40, a plurality of the sensing units 210, a plurality of the amplifying units 220, a plurality of the first sampling units 20, and a plurality of the second sampling units 30.

There is an equal number of sensing units 210, amplifying units 220, first sampling units 20, and second sampling units 30.

Each of the sensing units 210 is correspondingly connected to an amplifying unit 220, and each of the amplifying units 220 is correspondingly connected to a first sampling unit 20 and a second sampling unit 30 respectively. Each first sampling unit 20 and each second sampling units 30 is connected to the holding unit 40, and the holding unit 40 is electrically connected to the converting unit 230.

The output terminal of each first sampling unit 20 is connected to the first input terminal 431 of the holding unit 40, and the output terminal of each second sampling unit 30 is connected to the second input terminal of the 432 of the holding unit 40. Both the first output terminal 433 and the second output terminal 434 of the holding unit 40 are electrically connected to the converting unit 230.

The sensing unit 210, the amplifying unit 220, the first sampling unit 20, and the second sampling unit 30 that are electrically connected to each other constitute a signal collecting unit 50. In the embodiment, the electronic device 200a includes the converting unit 230, the holding unit 40, and a plurality of the signal collecting units 50. A plurality of the signal collecting units 50 are electrically connected to the holding unit 40, and the holding unit 40 is electrically connected to the converting unit 230.

The first sampling unit 20 and the second sampling unit 30 in the signal collecting unit 50 and the holding unit 40 constitute the sample holding circuit 100.

It can be understood that the switches (for example, the first to eighth switches S1 to S8) in the signal collecting unit 50 can be controlled to be closed or opened by triggering a clock signal, to make the first input terminal 431 and the second input terminal 432 of the holding unit 40 time-share to receive the first sampling voltage VIN1 and the second sampling voltage VIN2 of the first sampling unit 20 and the second sampling unit 30. The first output terminal 433 and the second output terminal 434 of the holding unit 40 are time-divided to output the first voltage VOP and the second voltage VON to the converting unit 230, so as to realize the multi-channel sample and hold function. In this way, the circuit structure can be effectively simplified and the use of amplifiers can be reduced, not only reducing the size of the circuit board, but also effectively improving the signal-to-noise ratio.

In an embodiment, the sensing unit 210 may be a photoelectric sensor, a touch sensor, a microelectromechanical (MEMS) sensor, or the like.

It can be understood that the present disclosure connects the first sampling unit 20 and the second sampling unit 30 of the sample holding circuit 100 to the signal input terminal 10 respectively, and when the first clock signal is triggered, the first clock signal charges the first sampling unit 20 by turning on the corresponding switch, so as to obtain the first sampling voltage VIN1; when the second clock signal is triggered, the second clock signal charges the second sampling unit 30 by turning on the corresponding switch, so as to obtain the second sampling voltage VIN2. When the third clock signal is triggered, the third clock signal turns on the corresponding switch, to input the first sampling voltage VIN1 and the second sampling voltage VIN2 to the holding unit 40, to output the corresponding voltage VOP and second voltage VON. In this way, the sample holding circuit 100 provided by the present disclosure can realize the sampling of voltages at different times without setting corresponding delay units or processing units, thereby effectively simplifying the circuit structure and reducing the use of amplifiers, also reducing the size of the circuit board.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A sample holding circuit comprising:
   a signal input terminal configured for receiving a first reference voltage or a second reference voltage;
   a first sampling unit electrically connecting to the signal input terminal; wherein the first sampling unit samples the first reference voltage when a first clock signal is triggered, to obtain a first sampling voltage;
   a second sampling unit electrically connecting to the signal input terminal; wherein the second sampling unit samples the second reference voltage when a second clock signal is triggered, to obtain a second sampling voltage; and
   a holding unit electrically connecting to each of the first sampling unit and the second sampling unit; wherein the holding unit receives the first sampling voltage and the second sampling voltage when a third clock signal is triggered;
   wherein the first sampling unit comprises a first switch, a second switch, a first sampling capacitor, a third switch, and a fourth switch; a first terminal of the first switch is electrically connected to the signal input terminal, and a second terminal of the first switch is electrically connected to a first terminal of the first sampling capacitor, a second terminal of the first sampling capacitor is electrically connected to a first terminal of the third switch, and a second terminal of the third switch is electrically connected to the holding unit, a first terminal of the second switch is grounded, a second terminal of the second switch is electrically connected between the first switch and the first sampling capacitor, and a first terminal of the fourth switch is grounded, and a second terminal of the fourth switch is electrically connected between the first sampling capacitor and the third switch;
   wherein the second sampling unit comprises a fifth switch, a sixth switch, a second sampling capacitor, a seventh switch, and an eighth switch; a first terminal of the fifth switch is electrically connected to the signal input terminal, and a second terminal of the fifth switch is electrically connected to a first terminal of the second sampling capacitor, a second terminal of the second sampling capacitor is electrically connected to a first end of the seventh switch, and a second end of the seventh switch is electrically connected to the holding unit, a first terminal of the sixth switch is grounded, a second terminal of the sixth switch is electrically connected between the fifth switch and the second sampling capacitor, a first end of the eighth switch is grounded, and a second end of the eighth switch is electrically connected between the second sampling capacitor and the seventh switch; and
   when the first clock signal is triggered, the first switch and the fourth switch are turned on, the second switch, the third switch, the fifth switch, the sixth switch, the seventh switch, and the eighth switch are turned off, and the signal input terminal receives the first reference voltage to charge the first sampling capacitor.

2. The sample holding circuit according to claim 1, wherein the holding unit comprises a first amplifier, a first holding capacitor, and a second holding capacitor; the first amplifier includes a first input terminal, a second input terminal, a first output terminal, and a second output terminal; the first input terminal of the first amplifier is electrically connected to the second terminal of the third switch, the second input terminal of the first amplifier is electrically connected to the second terminal of the seventh switch, and both ends of the first holding capacitor are electrically connected to the first input terminal and the first output terminal of the first amplifier respectively, both ends of the second holding capacitor are electrically connected to the second input terminal and the second output terminal of the first amplifier respectively.

3. The sample holding circuit according to claim 2, wherein
   when the second clock signal is triggered, the fifth switch and the eighth switch are turned on, the first switch, the second switch, the third switch, the fourth switch, the sixth switch, and the seventh switch are turned off, and the signal input terminal receives the second reference voltage to charge the second sampling capacitor.

4. The sample holding circuit according to claim 3, wherein when the third clock signal is triggered, the second switch, the third switch, the sixth switch, and the seventh switch are all turned on, the first switch, the fourth switch, fifth switch, the eighth switch are turned off, and the holding unit receives the first sampling voltage and the second sampling voltage.

5. The sample holding circuit according to claim 1, wherein the first clock signal, the second clock signal, and the third clock signal are successively triggered in sequence.

6. The sample holding circuit according to claim 2, wherein a capacitance value of the first sampling capacitor is equal to a capacitance value of the second sampling capacitor, and a capacitance value of the first holding capacitor is equal to a capacitance value the second holding capacitor.

7. The sample holding circuit according to claim 2, wherein the first input terminal is a reverse input terminal, the second input terminal is a forward input terminal, the first output terminal is a forward output terminal, and the second output terminal is a reverse output terminal.

8. The sample holding circuit according to claim 3, wherein the holding unit comprises a first reset switch and a second reset switch, the first reset switch controls discharge of the first holding capacitor, and the second reset switch controls discharge of the second holding capacitor.

9. An electronic device, comprising:
   a sensing unit;
   an amplifying unit;
   a converting unit; and a sample holding circuit; wherein the sensing unit, the amplifying unit, the sample holding circuit, and the converting unit are electrically connected in sequence;

the sample holding circuit comprising:
- a signal input terminal configured for receiving a first reference voltage or a second reference voltage;
- a first sampling unit electrically connecting to the signal input terminal; wherein the first sampling unit samples the first reference voltage when a first clock signal is triggered, to obtain a first sampling voltage;
- a second sampling unit electrically connecting to the signal input terminal; wherein the second sampling unit samples the second reference voltage when a second clock signal is triggered, to obtain a second sampling voltage; and
- a holding unit electrically connecting to each of the first sampling unit and the second sampling unit; wherein the holding unit receives the first sampling voltage and the second sampling voltage when a third clock signal is triggered;
- wherein the first sampling unit comprises a first switch, a second switch, a first sampling capacitor, a third switch, and a fourth switch; a first terminal of the first switch is electrically connected to the signal input terminal, and a second terminal of the first switch is electrically connected to a first terminal of the first sampling capacitor, a second terminal of the first sampling capacitor is electrically connected to a first terminal of the third switch, and a second terminal of the third switch is electrically connected to the holding unit, a first terminal of the second switch is grounded, a second terminal of the second switch is electrically connected between the first switch and the first sampling capacitor, and a first terminal of the fourth switch is grounded, and a second terminal of the fourth switch is electrically connected between the first sampling capacitor and the third switch;
- wherein the second sampling unit comprises a fifth switch, a sixth switch, a second sampling capacitor, a seventh switch, and an eighth switch; a first terminal of the fifth switch is electrically connected to the signal input terminal, and a second terminal of the fifth switch is electrically connected to a first terminal of the second sampling capacitor, a second terminal of the second sampling capacitor is electrically connected to a first end of the seventh switch, and a second end of the seventh switch is electrically connected to the holding unit, a first terminal of the sixth switch is grounded, a second terminal of the sixth switch is electrically connected between the fifth switch and the second sampling capacitor, a first end of the eighth switch is grounded, and a second end of the eighth switch is electrically connected between the second sampling capacitor and the seventh switch; and
- when the first clock signal is triggered, the first switch and the fourth switch are turned on, the second switch, the third switch, the fifth switch, the sixth switch, the seventh switch, and the eighth switch are turned off, and the signal input terminal receives the first reference voltage to charge the first sampling capacitor.

10. The electronic device according to claim 9, wherein the holding unit comprises a first amplifier, a first holding capacitor, and a second holding capacitor; the first amplifier comprises a first input terminal, a second input terminal, a first output terminal, and a second output terminal; the first input terminal of the first amplifier is electrically connected to the second terminal of the third switch, the second input terminal of the first amplifier is electrically connected to the second terminal of the seventh switch, and both ends of the first holding capacitor are electrically connected to the first input terminal and the first output terminal of the first amplifier respectively, both ends of the second holding capacitor are electrically connected to the second input terminal and the second output terminal of the first amplifier respectively.

11. The electronic device according to claim 10, wherein
- when the second clock signal is triggered, the fifth switch and the eighth switch are turned on, the first switch, the second switch, the third switch, the fourth switch, the sixth switch, and the seventh switch are turned off, and the signal input terminal receives the second reference voltage to charge the second sampling capacitor;
- when the third clock signal is triggered, the second switch, the third switch, the sixth switch, and the seventh switch are all turned on, the first switch, the fourth switch, fifth switch, the eighth switch are turned off, and the holding unit receives the first sampling voltage and the second sampling voltage.

12. The electronic device according to claim 9, wherein the first clock signal, the second clock signal, and the third clock signal are successively triggered in sequence.

13. The electronic device according to claim 10, wherein a capacitance value of the first sampling capacitor is equal to a capacitance value of the second sampling capacitor, and a capacitance value of the first holding capacitor is equal to a capacitance value the second holding capacitor.

14. The electronic device according to claim 10, wherein the first input terminal is a reverse input terminal, the second input terminal is a forward input terminal, the first output terminal is a forward output terminal, and the second output terminal is a reverse output terminal.

15. The electronic device according to claim 11, wherein the holding unit comprises a first reset switch and a second reset switch, the first reset switch controls discharge of the first holding capacitor, and the second reset switch controls discharge of the second holding capacitor.

16. An electronic device, comprising:
- a holding unit;
- a plurality of signal acquisition units; wherein the plurality of signal acquisition units are connected to the holding unit; a first sampling unit and a second sampling unit in each of the signal acquisition units form a sample holding circuit as claimed in claim 1 with the holding unit.

* * * * *